US008755197B1

(12) United States Patent
Greenberg et al.

(10) Patent No.: US 8,755,197 B1
(45) Date of Patent: Jun. 17, 2014

(54) HIGH-DENSITY, LOW-POWER COMPUTER CLUSTER FOR VIDEO STREAMING

(75) Inventors: Evan Pedro Greenberg, Palo Alto, CA (US); Robert Louis Segalla, Mountain View, CA (US); Bo Yang, Menlo Park, CA (US)

(73) Assignee: Veetle, Inc., Palo Alto, CA (US)

( * ) Notice: Subject to any disclaimer, the term of this patent is extended or adjusted under 35 U.S.C. 154(b) by 344 days.

(21) Appl. No.: 13/340,473

(22) Filed: Dec. 29, 2011

Related U.S. Application Data

(60) Provisional application No. 61/428,926, filed on Dec. 31, 2010.

(51) Int. Cl.
*H05K 7/14* (2006.01)
*H05K 7/18* (2006.01)

(52) U.S. Cl.
USPC .......................................... 361/796; 361/784

(58) Field of Classification Search
CPC .. H05K 7/1425; H05K 7/1421; H05K 7/1429
USPC .............................................. 361/679.57, 84
See application file for complete search history.

(56) References Cited

U.S. PATENT DOCUMENTS

| 3,317,798 | A | * | 5/1967 | Chu et al. | 361/696 |
|---|---|---|---|---|---|
| 3,328,646 | A | * | 6/1967 | Caillat | 361/796 |
| 3,349,288 | A | * | 10/1967 | Lohs et al. | 361/796 |
| 4,493,010 | A | * | 1/1985 | Morrison et al. | 361/698 |
| 4,679,121 | A | * | 7/1987 | Schomers et al. | 361/785 |
| 5,276,590 | A | * | 1/1994 | Budman et al. | 361/796 |
| 6,690,584 | B2 | * | 2/2004 | Uzuka et al. | 361/796 |
| 6,734,529 | B2 | * | 5/2004 | Kinsman et al. | 257/622 |
| 7,176,063 | B2 | * | 2/2007 | Sullivan et al. | 438/125 |
| 7,388,757 | B2 | * | 6/2008 | Moakes et al. | 361/788 |
| 7,764,511 | B2 | * | 7/2010 | Lee et al. | 361/796 |
| 8,295,051 | B2 | * | 10/2012 | Cheng | 361/727 |
| 2002/0012236 | A1 | * | 1/2002 | Dimarco | 361/796 |
| 2002/0181217 | A1 | * | 12/2002 | Patriche | 361/796 |
| 2005/0168938 | A1 | * | 8/2005 | Bash et al. | 361/687 |
| 2005/0207134 | A1 | * | 9/2005 | Belady et al. | 361/796 |
| 2006/0158866 | A1 | * | 7/2006 | Peterson et al. | 361/796 |
| 2007/0223200 | A1 | * | 9/2007 | Fujiya et al. | 361/727 |
| 2007/0247826 | A1 | * | 10/2007 | Grady et al. | 361/796 |
| 2008/0037222 | A1 | * | 2/2008 | Jha et al. | 361/709 |
| 2008/0043405 | A1 | * | 2/2008 | Lee et al. | 361/600 |
| 2008/0046617 | A1 | * | 2/2008 | Lee et al. | 710/104 |
| 2009/0154129 | A1 | * | 6/2009 | Clark et al. | 361/796 |

* cited by examiner

*Primary Examiner* — Adrian S Wilson
(74) *Attorney, Agent, or Firm* — Fenwick & West LLP

(57) ABSTRACT

A high-density low power computer cluster enables high bandwidth video streaming within a small physical footprint. A plurality of low power motherboards are densely arranged in a chassis compatible with a standard server rack. The motherboards are oriented vertically within the chassis and arranged into rows. Each motherboard serves as a node in live streaming network. External ports and indicators on the chassis enable convenient access and control of the motherboards from outside the chassis. Furthermore, a fan-based cooling system provides simultaneous cooling to the plurality of motherboards in the computing cluster.

20 Claims, 8 Drawing Sheets

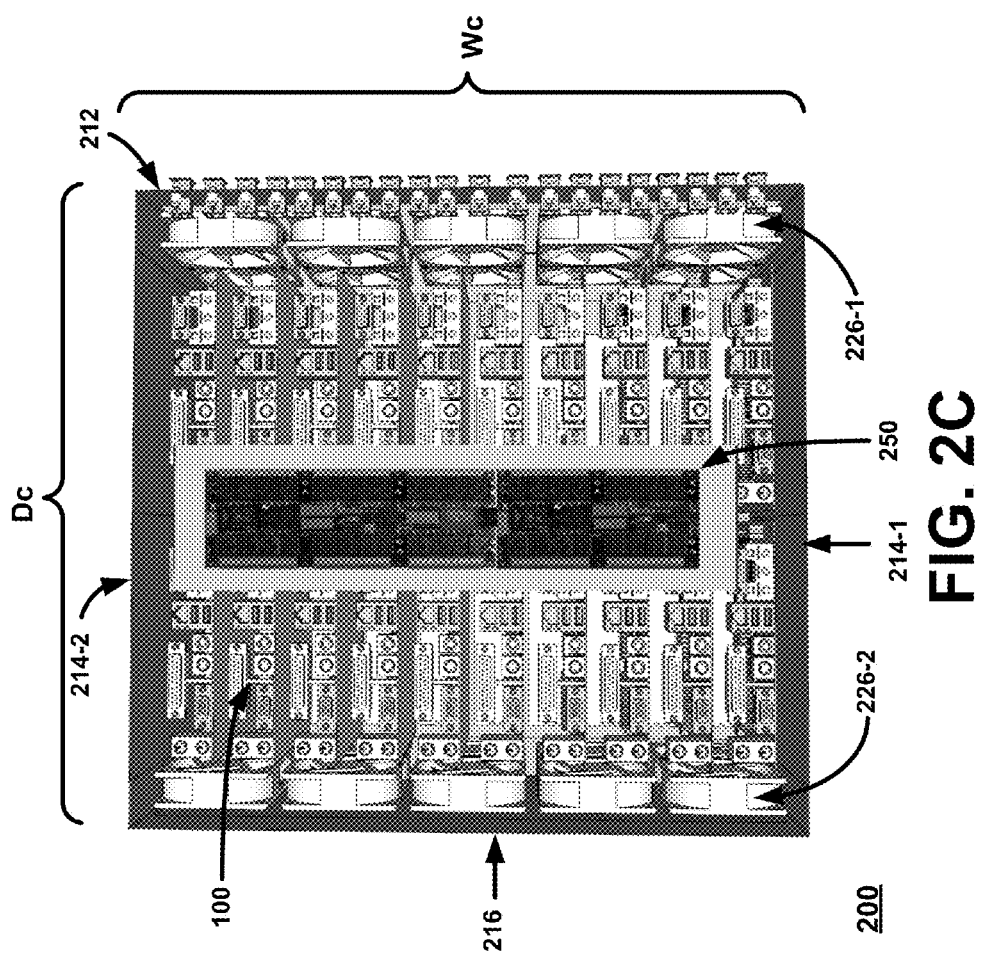

HIGH-DENSITY, LOW-POWER COMPUTER CLUSTER FOR VIDEO STREAMING

RELATED APPLICATIONS

This application claims priority from U.S. provisional application No. 61/428,926 entitled "High-Density, Low-Power Computer Cluster" filed on Dec. 31, 2010, the content of which is incorporated by reference herein in its entirety.

BACKGROUND

1. Field of the Invention

The invention relates generally to networked computer systems and more particularly to an architecture for live video streaming.

2. Description of the Related Arts

Applications such as live video distribution over the Internet can utilize a substantial amount of computing resources, and this requirement increases with the number of users. Large-scale content providers have traditionally favored server architectures that utilize a small number of high-powered computing systems to handle these video streaming tasks. First, using high-performance computers allows content providers to meet their needs with the fewest number of physical machines, thus keeping the managing, engineering, and maintenance resources to a minimum. Second, using a small number of high-performance machines enables companies to avoid the complexities associated with distributing software over a high number of systems. As a result, companies tend to choose to invest in faster and faster computers with huge amounts of memory and multiple Gigabit-plus network ports.

Despite these advantages, use of the highest performance computing technology can be prohibitively expensive for many entities. In addition to the high cost of the computers themselves, these high performance systems consume substantial power and produce significant amounts of heat, often requiring advanced cooling systems. These factors can add substantially to the cost and maintenance of the servers. Therefore, a low power, low cost system for high-bandwidth streaming is desirable.

SUMMARY

A high density computing cluster enables streaming of media content to a plurality of users. The computing cluster comprises a chassis having a width and a height substantially conforming to a range of a 2 to 6 rack-units (including non-integer numbers of rack-units). The chassis comprises a base plate, front and back panels structured substantially perpendicular to the base plate, and side panels structured substantially perpendicular to the base plate and to the front and back panels. A plurality of motherboards are arranged within the chassis. Each of the plurality of motherboards comprises a circuit board having a plurality of components mounted on a top surface of the circuit board. The plurality of components include a heat sink oriented to receive air flow in a direction parallel to the top surface of the circuit boards, a processor positioned to conduct heat to the heat sink, memory, and an Ethernet port. The memory stores program instructions executable by the processor for video streaming. Furthermore, each of the plurality of motherboards has a form factor substantially conforming to one of: a mini-ITX form factor, a micro-ATX form factor, a nano-ITX form factor, and a pico-ITX form factor. The plurality of motherboards are arranged within the chassis such that the top surfaces of each of the plurality of motherboards are substantially parallel to the side panels and substantially perpendicular to the base plate of the chassis. The plurality of motherboards are furthermore substantially aligned in at least two columns with each of the at least two columns comprising at least five motherboards. One or more fans is positioned to blow air from the front panel of the chassis to the back panel of the chassis and across the plurality of motherboards in the direction parallel to the top surfaces of the circuit boards. Furthermore, a plurality of Ethernet ports are included on an external surface of the chassis for electrically coupling to the Ethernet ports on the plurality of motherboards.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments described herein can be readily understood by considering the following detailed description in conjunction with the accompanying drawings.

FIG. 2C illustrates a top view of a high-density computer cluster with a relay board in accordance with the first embodiment.

DETAILED DESCRIPTION OF EMBODIMENTS

Figure 1:
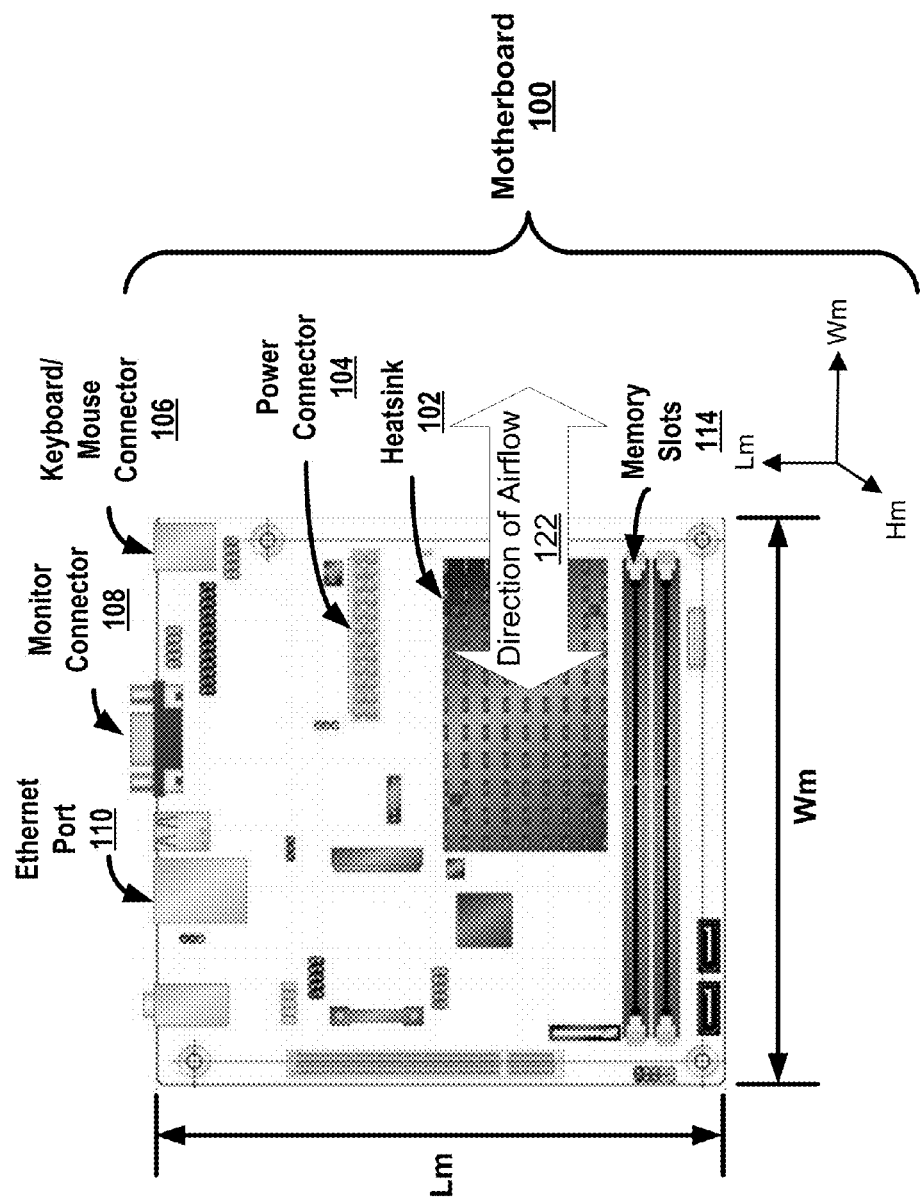
FIG. 1 illustrates an example of a motherboard for use as a node in accordance with one embodiment.

The teachings of the embodiments of the present invention can be readily understood by considering the following detailed description in conjunction with the accompanying drawings.

Reference in the specification to "one embodiment" or to "an embodiment" means that a particular feature, structure, or characteristic described in connection with the embodiments is included in at least one embodiment. The appearances of the phrase "in one embodiment" or "an embodiment" in various places in the specification are not necessarily all referring to the same embodiment.

Reference to this particular hardware is for exemplary purposes only and the scope of the invention is not limited to this particular component.

As used herein, the term "substantially" or "approximately" as applied to metrics such as length, area, volume, form factor, orientation (e.g., perpendicular or parallel), etc. means that the metric does not necessarily precisely conform to the state value, but rather the metric may vary within a reasonable range to achieve substantial conformance as will be understood to those of ordinary skill in the art.

Furthermore, the language used in the specification has been principally selected for readability and instructional purposes, and may not have been selected to delineate or circumscribe the inventive subject matter. Accordingly, the disclosure of the embodiments is intended to be illustrative, but not limiting, of the scope of the embodiments.

Overview of High-Density Computer Architecture

A high-density computer system enables live and high-quality video distribution over the Internet at considerably lower cost and lower power than conventional systems. Furthermore, the high-density computer system can provide high bandwidth capabilities suitable for video streaming within only a small physical space. For example, in one embodiment, a high-density computer cluster comprises a large number of computing nodes (e.g., 20-160 nodes) that fit into a relatively small chassis (e.g., a 2-6 rack-unit chassis) and can support 1 GBps of bandwidth or higher per node while consuming only around 20 W of power or less per node.

In live streaming applications, computational power and memory/disk space specifications are fairly minimal. For example, in one embodiment, an example software application for video streaming may utilize roughly 4 GB of memory per 1 GBps of network bandwidth and may run on commodity x86 hardware, although it may be complied for non-x86 platforms as well. An example of such a software application is the video serving software developed by Veetle, Inc. of Palo Alto, Calif. This software utilizes only modest computational resources beyond handling the receipt and transmission of data packets comprising the video stream. Furthermore, the nature of live streaming dictates that the number of live streams that can be supported simultaneously scales roughly linearly with the amount of bandwidth available. Therefore, a desirable architecture can sacrifice processing power in exchange for providing substantial bandwidth per unit of physical space at relatively low cost.

Video streaming software, such as that developed by Veetle, Inc., scale well. As a result, embodiments of the present invention do not encounter extra complexity in dealing with a large number of nodes. Furthermore, because the clustering uses a single image for each set of machines, the management and maintenance overhead scales much more slowly than the number of nodes.

In one embodiment, the high-density computer system is configured to have a large number of nodes, with each node responsible for a relatively small number of users. This configuration is beneficial because the failure of a single node impacts only those users who are directly connected with that node. Thus, having a large number of nodes reduces the percentage of users who are impacted by a given failure.

Architecture of Server Node

FIG. 1 illustrates an embodiment of a motherboard 100 that may be utilized as a server node in the video streaming network. In one embodiment, the motherboard 100 comprises a circuit board having a mini-ITX form factor. In this form factor, the motherboard 100 may have a width $W_m$ of approximately 6.7 inches and a length $L_m$ of approximately 6.7 inches. In alternative embodiments, the motherboard dimensions may vary from the mini-ITX form factor. For example, in one embodiment, the length $L_m$ and width $W_m$ may be in the range of 6 to 7 inches.

In alternative embodiments, a motherboard 100 having a different form factor may be used. For example, in one alternative embodiment, the motherboard 100 has a micro-ATX form factor. In this embodiment, the motherboard 100 may have a width $W_m$ of approximately 6.75 inches and a length $L_m$ of approximately 6.75 inches.

In another alternative embodiment, a motherboard 100 has a nano-ITX form factor. In this embodiment, the motherboard 100 may have a width $W_m$ of approximately 4.7 inches and a length $L_m$ of approximately 4.7 inches. In alternative embodiments, the motherboard dimensions may vary from the nano-ITX form factor. For example, in one embodiment, the length $L_m$ and width $W_m$ may be in the range of 4 to 5.5 inches.

In another alternative embodiment, a motherboard 100 has a pico-ITX form factor. In this embodiment, the motherboard 100 may have a width $W_m$ of approximately 3.9 inches and a length $L_m$ of approximately 2.8 inches. In alternative embodiments, the motherboard dimensions may vary slightly from the pico-ITX form factor. For example, in one embodiment, the length $L_m$ may be in the range of 2 to 3.5 inches and the width $W_m$ may be in the range of 3 to 4.5 inches.

In another alternative embodiment, a motherboard 100 has a mobile-ITX form factor. In this embodiment, the motherboard 100 may have a width $W_m$ of approximately 2.4 inches and a length $L_m$ of approximately 2.4 inches. In alternative embodiments, the motherboard dimensions may vary slightly from the mobile-ITX form factor. For example, in one embodiment, the length $L_m$ and the width $W_m$ may be in the range of 2 to 3 inches.

In any of the various form factors described above, the motherboard 100 has a plurality of components mounted on a top surface of a circuit board. These components give the motherboard 100 a finite height $H_m$ represented by the maximum height of the various components (e.g., Ethernet port 110, monitor connector 108, keyboard/mouse connector 106, power connector 104, heatsink 102, memory slots 114, and other possible components) For example, in one embodiment, the height $H_m$ may be approximately 1.5 inches. In other embodiments, the height $H_m$ may be in the range of 0.5 to 2.5 inches.

In one embodiment, the motherboard 100 comprises a set of ports, connectors, and other components typically found on a motherboard. For example, in one embodiment, the motherboard includes a 1.67 Ghz or faster processor (located under the heatsink 102 and coupled to conduct heat to the heatsink 102), memory slots 114 supporting, for example, 2 GB or more of memory, a power connector 104, a keyboard/mouse connector 106, a monitor connector 108, and an Ethernet port 110. In one embodiment, the heatsink 102 comprises a plurality of metallic ridges oriented parallel to the width dimension of the motherboard 100. For improved cooling, an external fan can provide airflow over the heatsink 102 in the direction parallel to the ridges (i.e., parallel to the width dimension of motherboard 100 as indicated by the arrow 122). In one embodiment, the motherboard 102 comprises a power-efficient motherboard consuming, for example, less than 30 W (e.g., approximately 20 W). In various alternative embodiments, the motherboard 100 may have different, fewer, or additional components. For example, in some embodiments, the motherboard 100 may not include the monitor connector 108 and/or keyboard/mouse connector 106. In various alternative embodiments, the components described above may be positioned at different physical locations on the motherboard 100.

In one embodiment, the memory slots 114 hold memory that stores computer-executable program instructions for a video streaming application. In operation, these instructions are loaded by the processor (under heatsink 102) and executed to carry out the video streaming functions described above. Generally, these functions include sending and receiving data via the Ethernet port 110. In one embodiment, the monitor connector 108 and keyboard/mouse connector 106 are not directly utilized in operation, although they may nevertheless be present because such connectors are typically included in commercially available and/or non-customizable motherboards that could be utilized as the motherboard 100.

Examples of commercially available motherboards 100 that may be used in the described architecture include the Atom™ D510MO motherboard and the D525MW motherboard produced by Intel Corporation of Santa Clara, Calif. Commercially available and/or non-customizable motherboards have the advantage of being relatively inexpensive in contrast to, for example, customized motherboards used in other server architectures. However, the described principles can be applied to any motherboard 100 having the characteristics described herein.

System Architecture

Figure 2A:
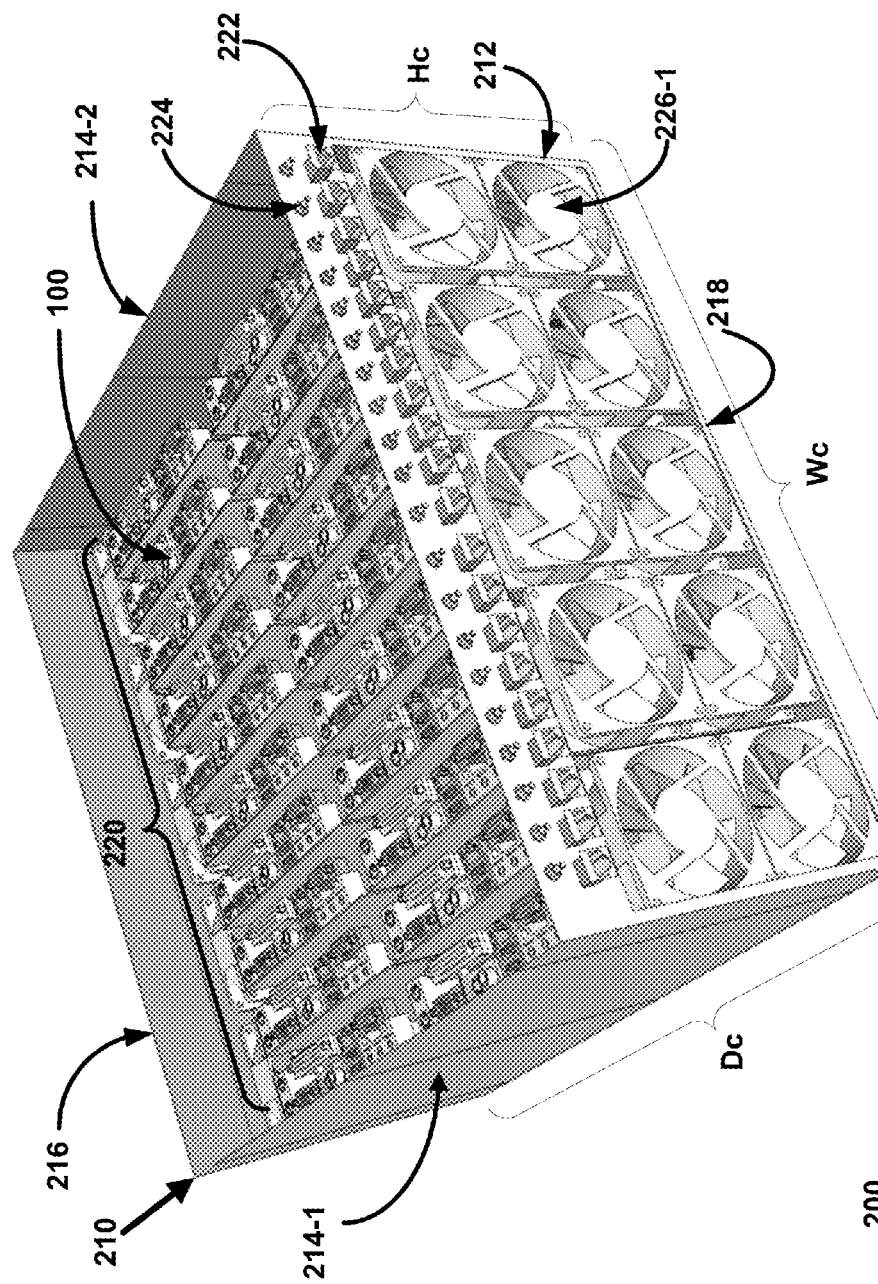
FIG. 2A illustrates a perspective view of a high-density computer cluster in accordance with a first embodiment.
Figure 2B:
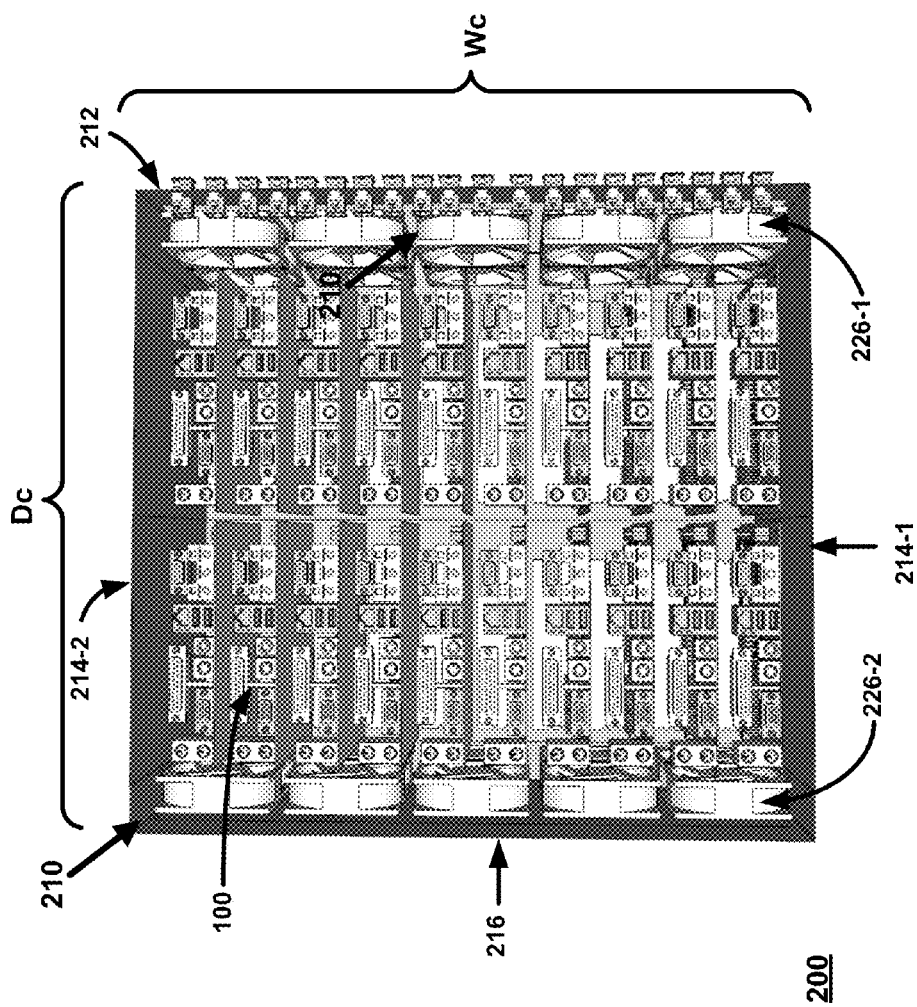
FIG. 2B illustrates a top view of a high-density computer cluster in accordance with the first embodiment.

FIGS. 2A-2B illustrate various views of a first embodiment of a high density computing cluster system 200. Specifically, FIG. 2A illustrates a perspective of the high density computing cluster system 200 and FIG. 2B illustrates a top view of the high density computing cluster system 200. The computing cluster system 200 comprises a plurality of motherboards 100 housed within a chassis 210. Various wiring and coupling to and from the motherboards 100 are omitted from the FIGs. for clarity of description. However, in practice such wiring may also be housed within the chassis 210 in order to utilize the functionalities of the motherboards 100 and enable video streaming (e.g., connecting a power supply to the power connector 104 to power the motherboard 100 and connecting an Ethernet cable to the Ethernet port 110 to send and receive data between the motherboard 100 and an external device.)

In one embodiment, the chassis 210 has external dimensions for compatibility or substantial conformance with a standard "rack" or "cabinet" in a data center. Under this standard, U or RU stands for "rack-unit," which is the canonical measurement of volume in a data center, where one rack-unit is a measure of space 1.75 inches high and 19 inches wide by no more than 36 inches deep. Frequently, a rack-unit is also prefixed by a number (e.g., 1 U, 2 U, 3 U) to indicate a volume which is a multiple (e.g., one, two, or three times) the height of a single rack-unit while maintaining the same footprint. A typical "rack" or "cabinet" in a data center is 42 U high. Furthermore, in some embodiments, the chassis 210 may have a height substantially conforming to a fractional (i.e., non-integer) number of rack units (e.g., 4.5 rack-units, 5.5 rack units, etc.)

The chassis 210 has a front panel 212, side panels 214 (e.g., a left side panel 214-1 and a right side panel 214-2), a back panel 216, and a bottom plate 218. In one embodiment, the chassis 210 comprises a box or partial-box structure such that the front panel 212, back panel 216, and side panels 214 are all substantially perpendicular to the bottom plate 218, and the back panel 216 and front panel 212 are each substantially perpendicular to the side panels 214. In one embodiment, a top panel (not shown) may also be included to completely enclose the motherboards 100 within the chassis 210. In one embodiment, the chassis 210 has a height Hc within the range of 6 to 10 inches (e.g., approximately 8.75 inches or the height of a standard 5 rack-unit rack). Furthermore, in one embodiment, the chassis has a width We within in the range of 15 to 25 inches (e.g., approximately 19 inches or the width of a standard rack), and a depth Dc within the range of 12 to 20 inches (e.g., approximately 17 inches).

The chassis 210 houses a plurality of motherboards 100. In one embodiment, the motherboards 100 are arranged in a plurality of columns 220. For example, in one embodiment, the motherboards 100 are arranged in two columns with ten motherboards 100 in each column 22. In an alternative embodiment, a different number of motherboards 100 may be used (e.g., five or more motherboards in each column). In one embodiment, the motherboards 100 are positioned vertically in the chassis 210, i.e., the motherboards 100 are oriented so that the top surfaces of the circuit boards are substantially perpendicular to the bottom plate 218 and substantially parallel to the side panels 214. In the illustrated embodiment, the motherboards 100 are oriented such that the widths We of the boards are substantially parallel to the bottom plate 218, and the heights Hc are substantially perpendicular to the bottom plate 218. Furthermore the various ports such as the Ethernet port 110 are conveniently positioned at the top of the chassis 210 so that they can be easily accessed.

In one embodiment, the chassis 210 includes standoffs (e.g., small-diameter rods) on the inside of the panels which serve to keep the motherboards 210 in the desired position and orientation. Furthermore, to keep the heatsinks 102 from one motherboard 100 from potentially shorting out the metal pins from an adjacent motherboard 100, a bolt (e.g., a 1.5" bolt) may be inserted in one or more mounting holes on the motherboards 100. A number of metal and/or nylon nuts of various shapes and sizes followed by a cap (e.g., a nylon acorn nut or a simple nylon hex nut) may be used to prevent the bolt from moving about. The cap can extends a little past the heatsink 102 on the motherboard 100 and make contact with the adjacent motherboard 100, enforcing a minimum distance between heatsink 102 and neighboring motherboard 100. By varying the end caps from one board to the next within a column it is possible to adjust the total length of the column so that each column just fits inside the chassis 210. Additionally, the motherboard 100 at the far ends of the columns may get another bolt (e.g., a 2" bolt) and an extra metal and/or nylon hex nut or two between the bolt head and motherboard 100 to keep the metal pins on the bottom of the motherboard 100 from making contact with the sides of the chassis 210.

In one embodiment, the chassis 210 further includes a plurality of Ethernet ports 222 accessible externally to the chassis 210 (e.g., in the topmost 1 U of the chassis 210). These ports 222 can comprise a portion of an Ethernet-to-Ethernet coupler (for example, a female-to-female coupler) with the other portion of the couple internal to the chassis 210, i.e., on the interior side of front panel 212. This allows the Ethernet ports 110 on the motherboards 100 to be coupled (e.g., using a standard Ethernet cable) to the exterior Ethernet ports 222, thereby providing easily accessible connections externally to the chassis 210. Ethernet cables may then connect from the external Ethernet ports 222 to, for example, a rack-mounted switch that aggregates traffic to the Internet over one or more fiber-optic 10-Gigabit links. In other embodiments, different or additional ports may be positioned on an external portion of the chassis 210 to provide access to other input or output ports on the motherboards 100.

In one embodiment, power indicators 224 (e.g., light-emitting diodes) are also mounted on an external surface of the chassis 222 (e.g., in the top-most 1 U of the chassis 210). The power indicators 224 can be coupled to power indicator pins on the motherboards 100 so that they indicate which of the motherboards 100 are powered on and which are powered off. Connecting these indicator pins to an indicator 224 external to the chassis 210 enables easy diagnosis of the motherboards' status from outside the chassis 210 without having to access internal pins of the individual motherboards 100. In one embodiment, the power indicators 224 may also include a switch component (e.g., a momentary switch) which may be connected to the reset switch or power switch pins on the motherboards 100 enabling easy access to reboot, power on, or power off a given motherboard from outside the chassis 210 without having to access internal pins of the individual motherboards 100. In another alternative embodiment, the switch component may be included without the indicator light 224.

In one embodiment, one or more fans 226-1, 226-2 (e.g., 80 mm fans) are mounted on a panel of the chassis 210 (e.g., the front panel 212 and/or back panel 216). In one embodiment, the fans 226 are positioned flush against the bottom of the chassis 210 in line with the motherboards 100 to provide cooling. The fans are configured to blow or draw air across from the front to the back of the chassis 210 (or from the back to the front). Based on how the motherboards 100 are oriented within the chassis 210, the air will move across the heatsinks 102 in the appropriate direction 122 for efficiently moving heat from the heatsinks 102. In one embodiment, fans 226 on the front and back panels are configured to blow air in the same direction. Thus, for example, fans 226-1 on the front panel 212 may draw cool air from outside the chassis and push it across the motherboards 100, and fans 226-2 on the back panel 216 may draw warm air from the motherboards 100 and push it outside the chassis 212 (or vice versa).

In one embodiment, fans 226 with built-in LEDs may be used to make it clear whether or not a given fan is spinning. Alternatively, a fan 226 with a built-in tachometer may be used to monitor the performance of the various fans remotely. However, even without these fail-detection features, the system 200 may be sufficiently redundant (e.g., with two rows of fans) to allow for reasonable reliability even in the face of an occasional fan failure.

In one embodiment, various components may be mounted externally to the chassis 210 (e.g., on the side panels 214). For example, in one embodiment, one or more AC to 12V DC power supplies are mounted on an external surface of the chassis 210. Alternatively, AC to 12V DC power supplies may be mounted on top of the chassis 210. In another embodiment, a datacenter-provided 12V DC power source or AC-to-DC power supply external to the computer cluster 100 may directly provide 12V DC power to the computer cluster 100. The 12V DC power is converted to various voltage levels on each motherboard using separate DC-DC power supplies that plugs into power connectors 104 on the motherboards 100. For example, in one embodiment, a "PicoPSU-80" DC-DC power supply is used, which provides 80 Watts of power from a 12V DC input power source, where the 12V DC may come from either an external power supply or directly from a 12V DC circuit. In other alternative embodiment, power supplies having different voltage levels and wattages may be used to power the motherboards 100.

FIG. 2C illustrates a top view of the high density computer system 200 but additionally includes a relay board 250 within the chassis 210. The relay board 250 can be electrically coupled to each of the motherboards 100 to distribute power to the motherboards 100 from a power source. For example, in one embodiment, the relay board 250 distributes 12 VDC power to each motherboard from a 120/240 VAC to 12 VDC power supply. Each relay on the relay board 250 acts as a simple computer controlled light switch. By placing a relay in series between the power supply and the power connector 104 of the motherboard 100 and connecting a relay controller to a networked connection, the motherboards 100 can be turned on or off from a remote computer system.

In one embodiment, one or more small-diameter rods and a shelf may be added above the motherboards 100, on which the relay board 250 is mounted. This allows the relay board 250 to be readily accessible while also keeping it out of the way of the airflow inside the chassis 210. In one embodiment, controls for the relay 250 are brought outside the chassis 210 via an external port to enable control of the relay board 250 externally to the chassis 210. In alternative embodiments, PoE (Power over Ethernet) is used to power the individual motherboards 100, thus eliminating the relay board 250.

Figure 3A:
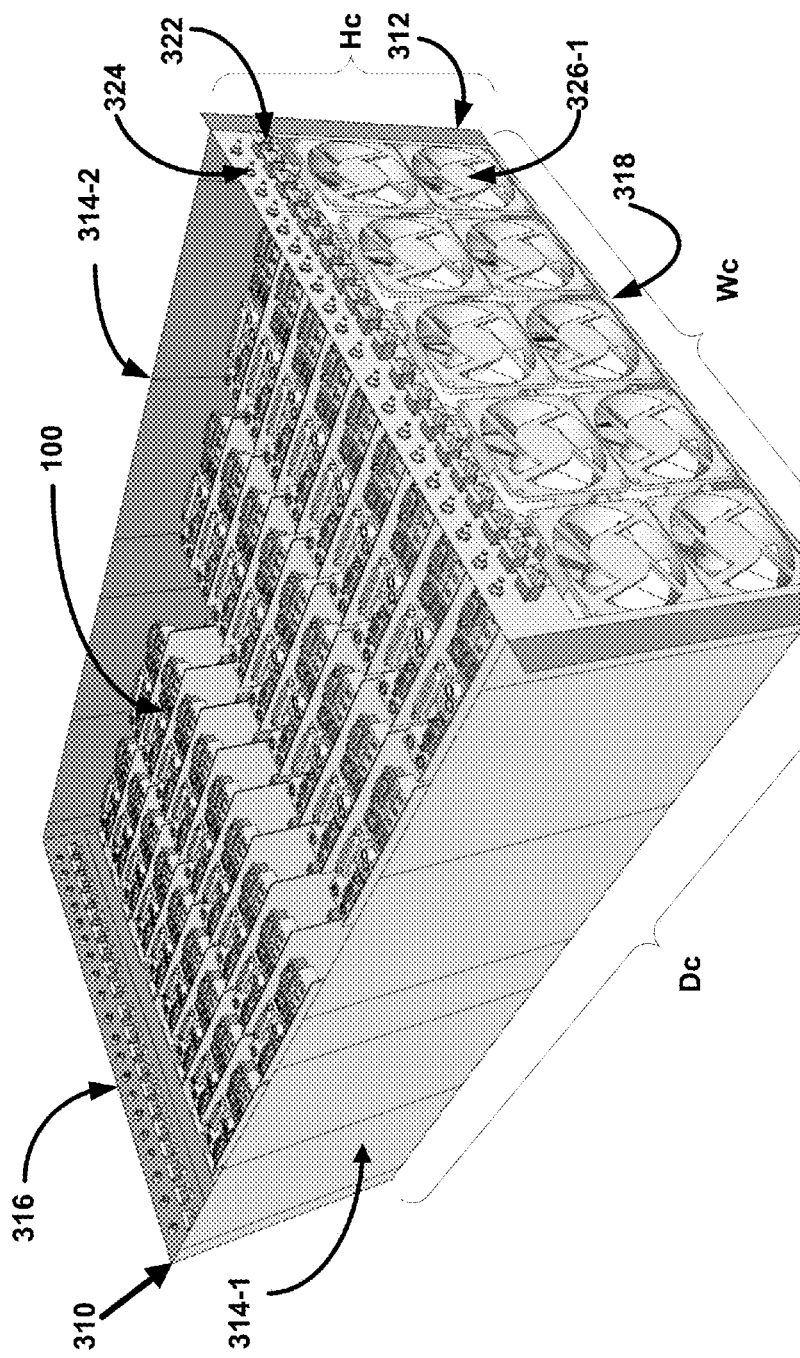
FIG. 3A illustrates a perspective view of a high-density computer cluster in accordance with a second embodiment.
Figure 3B:
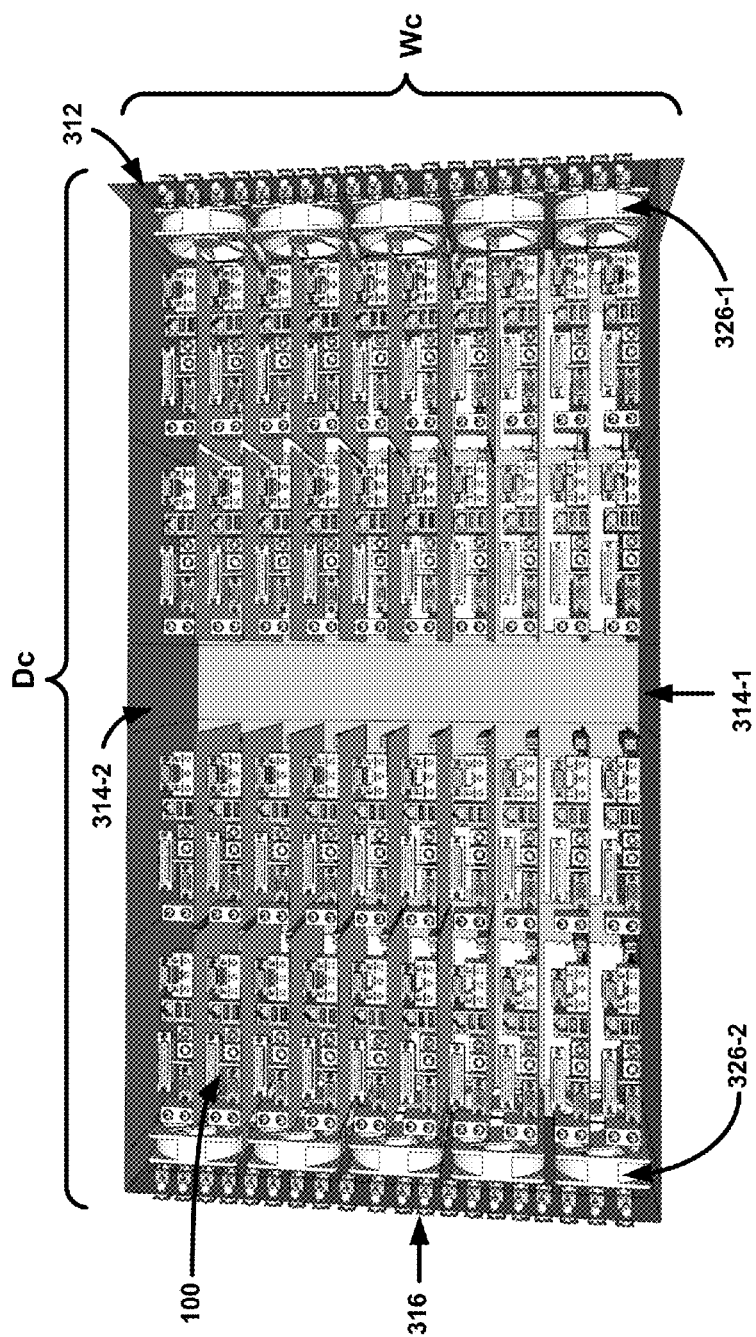
FIG. 3B illustrates a top view of a high-density computer cluster in accordance with the second embodiment.

FIG. 3A-3B illustrate various views of a second embodiment of a high density computing cluster system 300. Specifically, FIG. 3A illustrates a perspective of the high density computing cluster system 300 and FIG. 2B illustrates a top view of the high density computing cluster system 300. The high density computing cluster system 300 comprises a plurality of motherboards 100 housed within a chassis 310. The chassis 310 is similar to the chassis 210 and includes a base plate 318, a front panel 312, side panels 314 (e.g., left side panel 314-1 and right side panel 314-2), and a back panel 316. In this embodiment, the chassis 310 may have similar height Hc and width of the chassis 210 described above, but has a greater depth Dc within the range of, for example, 25 to 40 inches (e.g., approximately 35 inches). This enables the chassis 310 to fit, for example, four columns of ten motherboards 100 each within the chassis 310. In alternative embodiments, a different number of motherboards 100 may be placed in each column (e.g., at least five motherboards 100 in each column).

Furthermore, the chassis 310 similarly includes power indicator lights 324, Ethernet ports 322, and fans 326. In one embodiment, the chassis 310 includes a first set of Ethernet ports 322 and power indicator lights 324 on the front panel 312 of the chassis 310 that can be coupled to the set of motherboards 100 in the front portion of the chassis 310 (e.g., ports for 20 motherboards), and additionally includes a second set of Ethernet ports 322 and power indicator lights 324 on the back panel 316 of the chassis 310 that can be coupled to the set of motherboards 100 in the back portion of the chassis 310 (e.g., ports for an additional 20 motherboards).

Figure 3C:
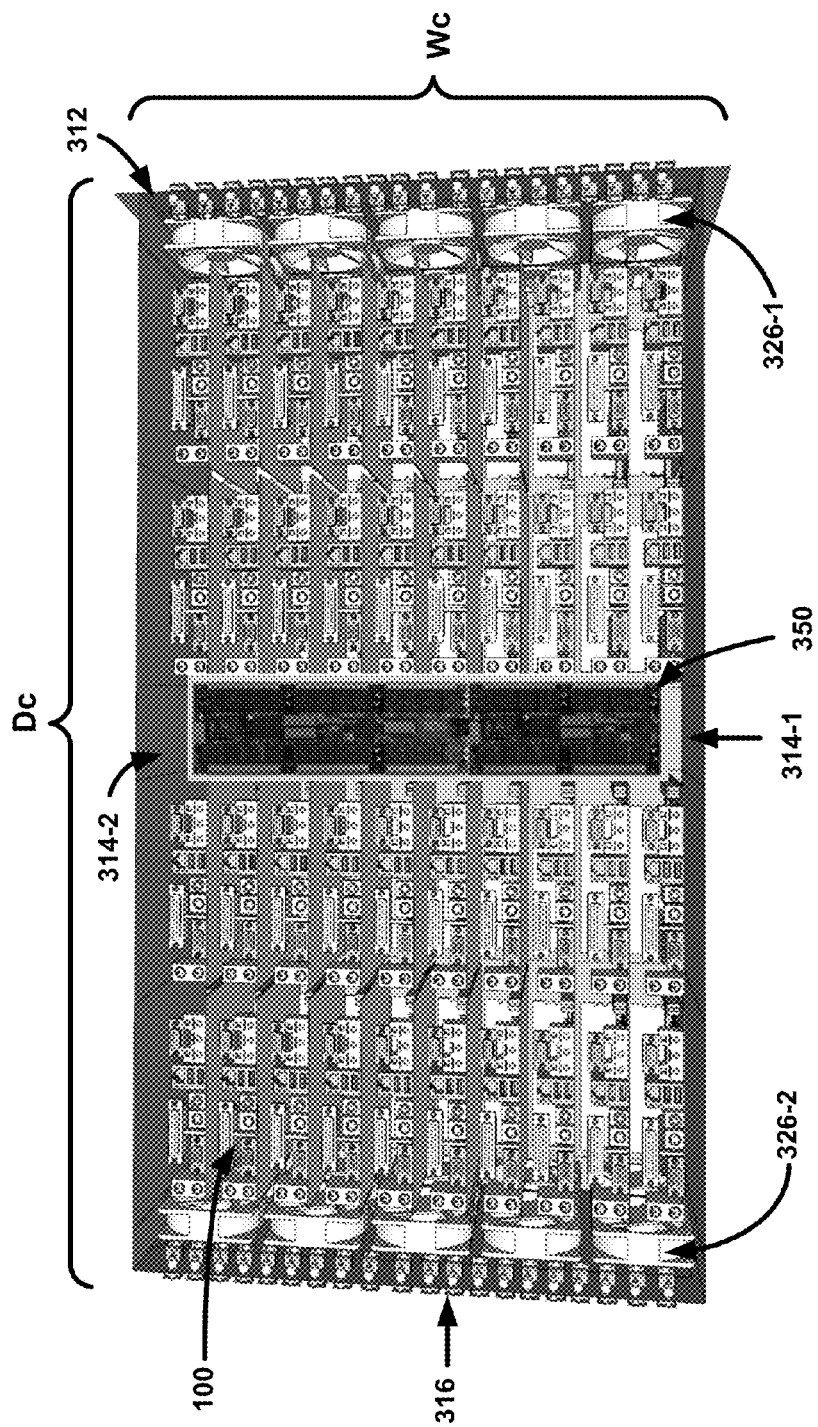
FIG. 3C illustrates a top view of a high-density computer cluster with a relay board in accordance with the second embodiment.

FIG. 3C illustrates a top view of the high density computer system 200 but additionally includes a relay board 350 within the chassis 310 that can be positioned in between the columns of motherboards 100. The relay board 350 can be electrically coupled to each of the motherboards 100 to distribute power to the motherboards 100 from a power source.

Alternative Form Factors and Chassis

In other alternative embodiments, different form factor motherboards 100 can be used to enable different arrangements of motherboards 100 within various sized chassis. For example, as illustrated in FIG. 2A-C, two columns of ten motherboards each having a mini-ITX form factor or micro-ATX form factor can fit into a 4 U chassis having similar width and depth as the chassis 210 of FIG. 2A-C. Alternatively, four columns of ten motherboards each having a mini-ITX form factor or micro-ATX form factor can fit into a 4 U chassis having similar width and depth as the chassis 310 of FIG. 3A-C. Alternatively, a 5 U or 6 U chassis (or a chassis having a non-integer number of rack-units in the range of 4 U-6 U) could instead be used with the mini-ITX or micro-ITX motherboards to accommodate extra space for wiring or various other components.

In another alternative embodiment, the motherboards 100 have a nano-ITX form factor. Using this form factor, six columns of ten motherboards each oriented similarly as described above can fit into a 3 U chassis having similar width and depth as the chassis 310 of FIG. 3A-C. Alternatively, three columns of ten motherboards each can fit into a 3 U chassis having similar width and depth as the chassis 210 of FIG. 2A-C. In one embodiment, a 4 U or 5 U chassis (or a chassis having a non-integer number of rack-units in the range of 3 U-5 U) may instead be used with the nano-ITX motherboards in order to have extra height for accommodating wiring or various other components.

In another alternative embodiment, the motherboards 100 have a pico-ITX form factor. Using this form factor, several different arrangements are possible because the form factor is asymmetric (i.e., the circuit board has a long side and a short side). For example, if the long dimension of the motherboards is oriented substantially parallel to the base plate, then up to eight columns of ten motherboards each can fit into a 2 U chassis having similar width and depth as the chassis 310 of FIG. 3A-C. Alternatively, four columns of ten motherboards each can fit into a 2 U chassis having similar width and depth as the chassis 210 of FIG. 2A-C. In one embodiment, a 3 U or 4 U chassis (or a chassis having a non-integer number of rack-units in the range of 2 U-4 U) may instead be used with the pico-ITX motherboards in order to have extra height for accommodating wiring or various other components.

Alternatively, if the long dimension of the pico-ITX form factor motherboards is oriented substantially parallel to the side panels, then up to eleven columns of ten motherboards each can fit into a 3 U chassis having similar width and depth as the chassis 310 of FIG. 3A-C. Alternatively, five columns of ten motherboards each can fit into a 3 U chassis having similar width and depth as the chassis 210 of FIG. 2A-C. In one embodiment, a 4 U or 5 U chassis (or a chassis having a non-integer number of rack-units in the range of 3 U-5 U) may instead be used with the pico-ITX motherboards in order to have extra height for accommodating wiring or various other components.

Full Rack Systems

Figure 4:
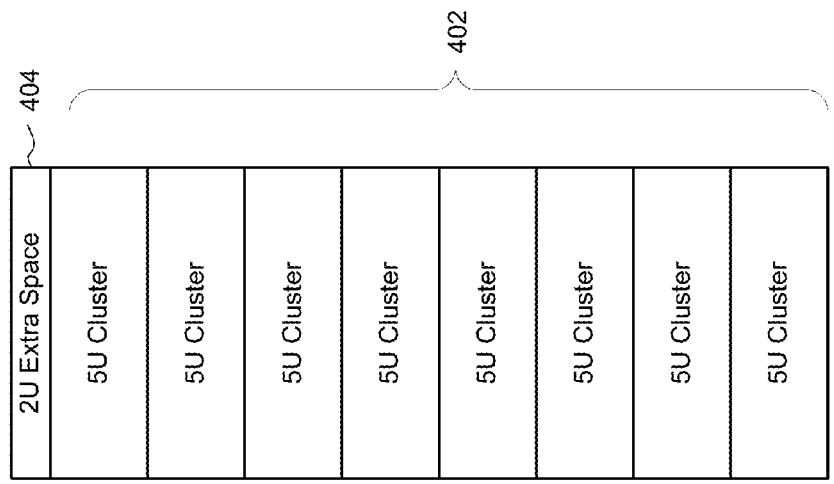
FIG. 4 illustrates a full rack configuration of a high-density computer cluster in accordance with an embodiment.

The described structures can be extended to accommodate a full rack of 42 U as illustrated in FIG. 4. For example, using the embodiment of FIG. 3 (40 nodes in 5 U of space), eight 5 U clusters 402 and 2 U of extra space 404 for accommodating additional components can fit within the full rack. This allows for 320 nodes to be placed within a full rack with 2 U of extra space for wiring or other components. Assuming each motherboard 100 can provide, for example, 1 GBps of bandwidth, this configuration will provide 320 Gbps of bandwidth in a single rack. Using smaller form-factor motherboards such as the configurations using nano-ITX or pico-ITX described above, even greater density can be achieved.

The described embodiment has the advantage of being potentially very low cost relative to custom server architecture. For example, based on 2010 prices, a 320 node full rack system can be assembled for approximately $50,000. In comparison, a traditional server rack using blade servers typically costs at least twice as much and provides only around 64 nodes. Because physical space is a significant component of data center cost, there is significant value in being able to achieve very high bandwidth in a small physical space, as achieved by the described embodiments. For example, a 36" by 19" by 42 U (73.5") rack has 50,274 cu in of space where one could place equipment. Using motherboards 100 having the mini-ITX or micro-ATX form factor as described above, it should theoretically feasible to place about 750 of such motherboards 100 in a single rack, assuming a very dense packing The embodiment of FIG. 3A could attains 320 motherboards in one rack, assuming eight 40-node clusters per 5 U of space, for a fill rate of 43%. In contrast, a more traditional arrangement would yield something in the range of a 5% to 10% fill rate at best. Alternative embodiments using pico-ITX or nano-ITX architectures could potentially achieve even higher fill rates.

The described embodiments also offer substantial power savings over a conventional server rack. The described application of low-power, low-cost hardware in high-density cluster configuration takes advantage of the concept that web traffic is parallelizeable and therefore exceptionally well-suited to low-power hardware. For example a 40 node cluster as described in FIG. 3 may consume, for example, about 160 W per rack unit or 20 W per node. The low power consumption enables the high density fill rate to be achieved without causing components to overheat. In contrast, a typical high-end server would consume about 160 W of power for only 1 U (one node).

Furthermore, the described embodiments allows for easily handling of failures. For example, because restarting a failed node only involves rebooting, remounting the read-only file system, and re-running the video serving software, they come back online very quickly after a failure, reducing the amount of service degradation caused by failure. Ultimately, having a large cluster of small nodes designed in the way described here attains higher reliability and lower management overhead at reduced cost.

Additional Alternative Embodiments

Embodiments of the present invention are not limited to the specific hardware elements used to create these clusters described in the example configurations above. Other alternative embodiment may utilize different CPUs, motherboards, fans, power supplies, chassis, securing structures, and other hardware components. For example in some alternative embodiments, the described principles may be applied even to motherboards/processors that do not conform to the standards discussed above. A different form factor would likely utilize a chassis with different specific dimensions than those described herein, and the specific number of boards one can place in a given number of rack units might also change. The underlying principles described herein may be applied to various other hardware components, including those not presently available.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

The invention claimed is:

1. A high-density computer system for streaming media content to a plurality of users, the computer system comprising:
    a chassis having a width and height substantially conforming to a range of a 2 to 6 rack-unit chassis, the chassis comprising:
        a base plate;
        front and back panels structured substantially perpendicular to the base plate; and side panels structured substantially perpendicular to the base plate and to the front and back panels;
    a plurality of motherboards arranged within the chassis, each of the plurality of motherboards comprising a circuit board having a plurality of components mounted on a top surface of the circuit board, the plurality of components including a heat sink oriented to receive air flow in a direction parallel to the top surface of the circuit boards, a processor positioned to conduct heat to the heat sink, memory, and an Ethernet port, the memory configured to store program instructions for video streaming over the Ethernet port and the processor configured to execute the program instructions, each of the plurality of motherboards furthermore having a form factor substantially conforming to one of: a mini-ITX form factor, a micro-ATX form factor, a nano-ITX form factor, and a pico-ITX form factor, the plurality of motherboards arranged within the chassis such that the top surfaces of each of the plurality of motherboards are substantially parallel to the side panels and substantially perpendicular to the base plate of the chassis, the plurality of motherboards further substantially aligned in at least two columns, each of the at least two columns comprising at least five motherboards.

2. The computer system of claim 1, further comprising:
one or more fans positioned to blow air from the front panel of the chassis to the back panel of the chassis and across the plurality of motherboards in the direction parallel to the top surfaces of the circuit boards.

3. The computer system of claim 1, further comprising:
a plurality of external Ethernet ports on an external surface of the chassis, the plurality of external Ethernet ports for electrically coupling to the Ethernet ports on the plurality of motherboards.

4. The computer system of claim 1, further comprising:
a plurality of power indicators viewable externally to the chassis, each of the plurality of power indicators electrically coupled to indicate whether one of the plurality of motherboards is powered on.

5. The computer system of claim 1, further comprising:
a relay board housed within the chassis, the relay board providing power to the plurality of motherboards.

6. The computer system of claim 1, wherein the chassis substantially conforms to one of a 4 rack-unit chassis and a 5 rack-unit chassis, and wherein the chassis has a depth in the range of 12 to 20 inches, and wherein the plurality of motherboards substantially conform to one of the mini-ITX or micro-ATX form factors.

7. The computer system of claim 6, wherein the plurality of motherboards are arranged in two columns with ten motherboards in each column.

8. The computer system of claim 1, wherein the chassis substantially conforms to one of a 4 rack-unit chassis and a 5 rack-unit chassis, and wherein the chassis has a depth in the range of 25 to 40 inches, and wherein the plurality of motherboards substantially conform to one of the mini-ITX or micro-ATX form factors.

9. The computer system of claim 8, wherein the plurality of motherboards are arranged in four columns with ten motherboards in each column.

10. The computer system of claim 1, wherein the chassis substantially conforms to one of a 3 rack-unit chassis and a 4 rack-unit chassis, and wherein the chassis has a depth in the range of 12 to 20 inches, and wherein the plurality of motherboards substantially conform to the nano-ITX form factor.

11. The computer system of claim 10, wherein the plurality of motherboards are arranged in three columns with ten motherboards in each column.

12. The computer system of claim 1, wherein the chassis substantially conforms to one of a 3 rack-unit chassis and a 4 rack-unit chassis, and wherein the chassis has a depth in the range of 25 to 40 inches, and wherein the plurality of motherboards substantially conform to the nano-ITX form factor.

13. The computer system of claim 12, wherein the plurality of motherboards are arranged in six columns with ten motherboards in each column.

14. The computer system of claim 1, wherein the chassis substantially conforms to one of a 2 rack-unit chassis and a 3 rack-unit chassis, and wherein the chassis has a depth in the range of 12 to 20 inches, and wherein the plurality of motherboards substantially conform to the pico-ITX form factor, and wherein a longest dimension of each of the plurality of motherboards is oriented substantially parallel to the base plate of the chassis.

15. The computer system of claim 14, wherein the plurality of motherboards are arranged in four columns with ten motherboards in each column.

16. The computer system of claim 1, wherein the chassis substantially conforms to one of a 2 rack-unit chassis and a 3 rack-unit chassis, and wherein the chassis has a depth in the range of 25 to 40 inches, and wherein the plurality of motherboards substantially conform to the pico-ITX form factor, and wherein a longest dimension of each of the plurality of motherboards is oriented substantially parallel to the base plate of the chassis.

17. The computer system of claim 16, wherein the plurality of motherboards are arranged in eight columns with ten motherboards in each column.

18. The computer system of claim 1, wherein the chassis substantially conforms to one of a 3 rack-unit chassis and a 4 rack-unit chassis, and wherein the chassis has a depth in the range of 25 to 40 inches, and wherein the plurality of motherboards substantially conform to the pico-ITX form factor, and wherein a longest dimension of each of the plurality of motherboards is oriented substantially parallel to the side panels of the chassis.

19. The computer system of claim 18, wherein the plurality of motherboards are arranged in eleven columns with ten motherboards in each column.

20. The computer system of claim 1, wherein the computing system achieves an output bandwidth of at least 320 Gbps within one full server rack of physical space.

* * * * *